US008832538B2

(12) United States Patent
Decesaris et al.

(10) Patent No.: US 8,832,538 B2
(45) Date of Patent: *Sep. 9, 2014

(54) DETECTING DATA TRANSMISSION ERRORS IN AN INTER-INTEGRATED CIRCUIT ('I²C') SYSTEM

(75) Inventors: Michael Decesaris, Carrboro, NC (US); Steven C. Jacobson, Mebane, NC (US); Luke D. Remis, Raleigh, NC (US); Gregory D. Sellman, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 188 days.

This patent is subject to a terminal disclaimer.

(21) Appl. No.: 13/530,318

(22) Filed: Jun. 22, 2012

(65) Prior Publication Data

US 2013/0346835 A1    Dec. 26, 2013

(51) Int. Cl.
*G06F 11/00* (2006.01)
*H03M 13/00* (2006.01)

(52) U.S. Cl.
USPC ........................................................ 714/800

(58) Field of Classification Search
CPC .......... H03M 13/09; G06F 11/10; G06F 1/04; G06F 1/26; G06F 13/4286; G06F 13/00; G06F 9/44; G06F 13/38; G06F 9/455; G06F 13/4291; H04L 12/26
See application file for complete search history.

(56) References Cited

U.S. PATENT DOCUMENTS

| 5,272,725 | A | 12/1993 | Jones et al. |
| 6,321,366 | B1 | 11/2001 | Tseng et al. |
| 7,417,576 | B2 | 8/2008 | Prestros |
| 2013/0343197 | A1 | 12/2013 | DeCesaris et al. |
| 2013/0346658 | A1 | 12/2013 | DeCesaris et al. |
| 2013/0346763 | A1* | 12/2013 | DeCesaris et al. ............ 713/300 |
| 2013/0346835 | A1 | 12/2013 | DeCesaris et al. |

* cited by examiner

*Primary Examiner* — Guerrier Merant
(74) *Attorney, Agent, or Firm* — Edward J. Lenart; Katherine S. Brown; Biggers Kennedy Lenart Spraggins LLP

(57) ABSTRACT

Detecting data transmission errors in an I²C system that includes a source device, an destination device, and a signal line coupling the I²C source and destination device, including: receiving, by the I²C destination device from the I²C source device, a data transmission signal, the data transmission signal encoded with a set of bits; detecting, by the I²C destination device, rise time of a preselected bit in the set of bits; if the detected rise time is less than a predefined threshold, determining that the I²C source device injected a parity bit in the signal, and if the detected rise time is not less than the predefined threshold, determining that the I²C source device did not inject a parity bit in the signal; and determining whether the data transmission signal includes an error in dependence upon the parity of the set of bits.

20 Claims, 5 Drawing Sheets

DETECTING DATA TRANSMISSION ERRORS IN AN INTER-INTEGRATED CIRCUIT ('I²C') SYSTEM

BACKGROUND OF THE INVENTION

1. Field of the Invention

The field of the invention is data processing, or, more specifically, methods, apparatus, and products for detecting data transmission errors in an Inter-Integrated Circuit ('I²C') system.

2. Description of Related Art

The Inter-Integrated Circuit ('I²C') data communications interface and protocol is used widely throughout computing and electronic systems for various reasons including the robustness and stability of the protocol. The protocol, however, does have a few limitations. One limitation, for example, is that the protocol does not support error detection and correction techniques such as parity bits. At the present, acknowledgements of receipt of a data transmission are utilized to provide some indication that data was received, but no error detection or error correction is provided by the I²C standard. Adding a parity bit into the I²C standard data patterns will increase the bit length of data transmissions, thereby lowering overall data transmission bandwidth. What is needed, therefore, is a way to include parity information in an I²C data transmission without lowering the overall effective bandwidth of the data signal.

SUMMARY OF THE INVENTION

Methods, apparatus, and products for detecting data transmission errors in an Inter-Integrated Circuit ('I²C') system are disclosed in this specification. The I²C system includes an I²C source device, an I²C destination device, and a data transmission signal line coupling the I²C source device and the I²C destination device, the data transmission signal line configured to carry data transmission signals between the I²C source device and I²C destination device. Detecting data transmission errors in an I²C system according to embodiments of the present invention includes: calculating, by the I²C source device, parity of a set of bits, the set of bits to be transmitted to the I²C destination device on the data transmission signal line; determining, by the I²C source device in dependence upon the calculated parity, whether to inject a parity bit in the set of bits; if the I²C source device determines to inject the parity bit, transmitting the set of bits in a data transmission signal with a preselected bit having a rise time less than a predefined threshold; and if the I²C source device determines not to inject the parity bit, transmitting the set of bits in a data transmission signal, with the preselected bit having a rise time not less than the predefined threshold.

Detecting data transmission errors in an I²C system according to embodiments of the present invention may also include: detecting, by the I²C destination device, rise time of a preselected bit in the set of bits of the data transmission signal; if the detected rise time of the preselected bit is less than a predefined threshold, determining that the I²C source device injected a parity bit in the data transmission signal, and if the detected rise time of the preselected bit is not less than a predefined threshold, determining that the I²C source device did not inject a parity bit in the data transmission signal; and determining, by the I²C destination device, whether the data transmission signal includes an error in dependence upon the parity of the set of bits of the data transmission signal.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
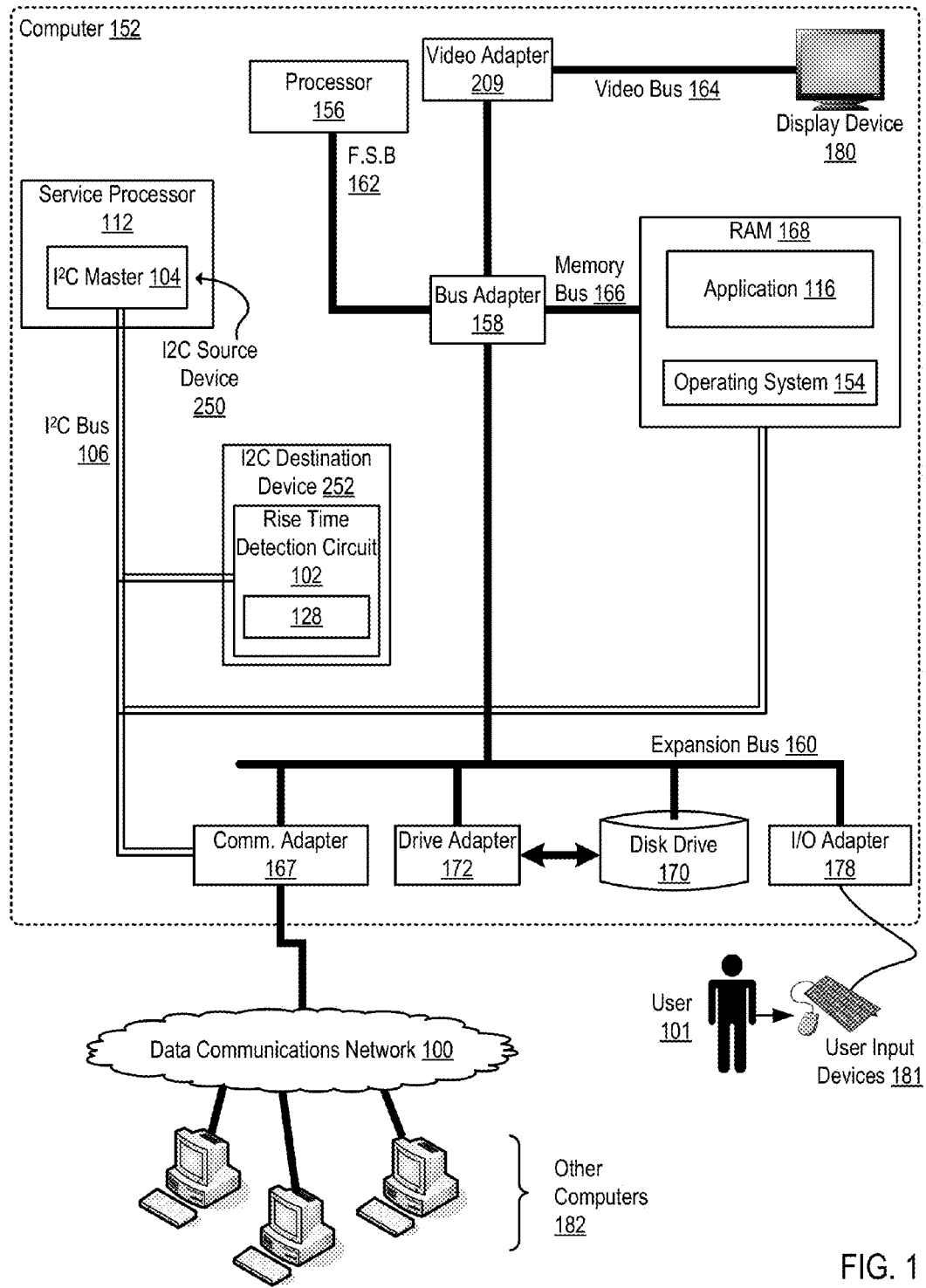
FIG. 1 sets forth a block diagram of an example system for detecting data transmission errors in an I2C system according to embodiments of the present invention.

Exemplary methods, apparatus, and products for detecting data transmission errors in an I²C system in accordance with the present invention are described with reference to the accompanying drawings, beginning with FIG. 1. FIG. 1 sets forth a block diagram of an example system for detecting data transmission errors in an I²C system according to embodiments of the present invention. The example system of FIG. 1 includes automated computing machinery comprising an exemplary computer (152) useful in detecting data transmission errors in an I²C system according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is an application (116), a module of computer program instructions for carrying out user-level data processing tasks. Examples of such applications include word processing applications, spreadsheet applications, multimedia library and playback applications, presentation applications, database applications, and so on. Also stored in RAM (168) is an operating system (154). Operating systems useful for detecting data transmission errors in an I²C system according to embodiments of the present invention include UNIX™, Linux™, Microsoft XP™, Windows 7™, AIX™, IBM's i5/OS™, and others as will occur to those of skill in the art. The operating system (154) and application (116) in the example of FIG. 1 are shown in RAM (168), but many components of such software typically are stored in non-volatile memory also, such as, for example, on a disk drive (170).

The computer (152) in the example of FIG. 1 also includes a service processor (112). A service processor as the term is used in this specification refers to a processor, field programmable gate array ('FPGA'), application specific integrated circuit ('ASIC') microcontroller, or the like, distinct from the main CPU (156), which manages platform-specific functions. Examples of such management include monitoring environmental conditions, handling certain error conditions, and otherwise communicating out-of-band with components of the computer (152). A service processor may include Read Only Memory ('ROM'), RAM, Electrically Erasable Programmable ROM ('EEPROM'), or other memory that includes computer program instructions executable by a processing core of the service processor (112).

In the example of FIG. 1, the service processor (112) communicates with components of the computer (152) through an out-of-band I²C bus (106). An I²C bus is a multi-master serial single-ended computer bus that is typically used to attach low-speed peripherals to a motherboard, embedded system, mobile communications device, serial processor, or other electronic device. The service processor (112) in the example of FIG. 1 is configured as an I²C master (104), while other peripherals, such as the communications adapter (167), RAM (168), and I²C slave device (252) are configured as I²C slaves.

Typical I²C busses include two signal lines, a serial clock line ('SCL') and a serial data line ('SDL'). Neither line, according to the prior art I2C standard, provides for error detection of data transmission. The I²C system in the example of FIG. 1, however, has been improved for detecting data transmission errors. The I²C system of FIG. 1 includes an I²C source device (250) and an I²C destination device (252). The I²C source device in the example of FIG. 1 is implemented as an I²C master (104) while the destination device (252) is implemented as an I²C slave (202). Readers of skill in the art will recognize, however, that the terms 'source' and 'destination' may be applied in any fashion, to either master or slave, as dictated by the direction of data communications between two devices. An I²C source device is, for any single data transmission, any I²C device (slave or master) transmitting the data transmission to another device. The intended receiver of that data transmission is described in this specification as an I²C destination device and may be implemented as any I²C device (slave or master).

In the example of FIG. 1 a data transmission signal line—the SDL of the I²C bus (106), for example—couples the I²C source device (250) and the I²C destination device (252). The data transmission signal line (106) is configured to carry data transmission signals between the I²C source device (250) and I²C destination device (252). The I²C source device in the example of FIG. 1 operates for data transmission error detection in accordance with embodiments of the present invention by calculating, by the I²C source device, parity of a set of bits where the set of bits to be transmitted to the I²C destination device on the data transmission signal line. Parity is an error detection scheme related to the number of logic high (binary '1') values in a bit pattern. Parity schemes come in two different types: even parity and odd parity. A parity bit—usually an additional bit to the bit pattern—is included by the sender to indicate to the receiver the parity that the bit pattern should be when received. When using even parity, the parity bit is set to 1 if the number of ones in a given set of bits (not including the parity bit) is odd, making the number of ones in the entire set of bits (including the parity bit) even. If the number of ones in a given set of bits is already even, it is set to a 0. When using odd parity, the parity bit is set to 1 if the number of ones in a given set of bits (not including the parity bit) is even, keeping the number of ones in the entire set of bits (including the parity bit) odd. In the example of FIG. 1, The I²C source device (250) may be configured for even or odd parity. The I²C source device (250) may calculate parity of the set of bits to be transmitted to the I²C destination device by counting the number of binary 1's in the set of bits to be transmitted to the destination device and determining whether the number is even or odd.

The I²C source device (250) may then determine, in dependence upon the calculated parity, whether to inject a parity bit in the set of bits. As mentioned above, the I²C source device (250) may be configured for either odd parity or even parity. The I²C source device (250) then may determine whether to inject a parity bit in dependence upon two factors: the I²C source device's parity configuration (odd or even) and the calculated parity (whether the number of binary 1's in the bit pattern is odd or even). The phrase 'inject a parity bit in the set of bits' refers to encoded a preselected bit in the set of bits with a parity value of '1.' If the parity bit is not injected the preselected bit is not encoded with a value and thus represents a parity value of '0.'

If the I²C source device (250) determines to inject the parity bit, the I²C source device (250) transmits the set of bits in a data transmission signal with a preselected bit having a rise time less than a predefined threshold. If the I²C source device (250) determines not to inject the parity bit, the I²C source device (250) transmits the set of bits in a data transmission signal, with the preselected bit having a rise time not less than the predefined threshold.

In the example of FIG. 1, rather than adding to a bit pattern an additional bit for parity, the I²C source device (250) effectively encodes the parity, through rise time manipulation, on another bit in the bit pattern. The term 'preselected' as used here refers to a bit in the bit pattern transmitted to the I²C destination device (252), where that bit is in a position of the bit pattern known to both source and destination. Consider, for example, in an 8-bit bit pattern that the first transmitted bit is the 'preselected' bit. In each transmission from the source to the destination in which the source device (250) injects a parity bit, the source device varies the rise time of the first bit. Being known to both the source and the destination, the bit is referred to as 'preselected.'

The I²C destination device (252) is also configured to perform error detection in accordance with embodiments of the present invention. The I²C destination device (252) receives, from the I²C source device (250), a data transmission signal encoded with a set of bits. The data transmission signal includes voltage alternating between a logic low voltage and a logic high voltage.

The I²C destination device (252) is also configured to detect rise time of the preselected bit in the set of bits of the data transmission signal. In the example of FIG. 1, the I²C destination device (252) includes a rise time detection circuit (102). The rise time detection circuit (102) in the example of FIG. 1 may be any processor, service processor, microcontroller, ASIC, FPGA, or other logic configured to detect rise time and determine whether the rise time is less than a predefined threshold (128). If the detected rise time of the preselected bit is less than a predefined threshold (128), the I²C destination device (252) determines that I²C source device (250) injected a parity bit in the data transmission signal—a parity value of '1'. If the detected rise time of the preselected bit is not less than the predefined threshold (128), the I²C destination device (252) determines that the I²C source device (250) did not inject a parity bit in the data transmission signal—a parity value of '0'.

The I²C destination device (252) then determines whether the data transmission signal includes an error in dependence upon the parity of the set of bits of the data transmission signal. If the data transmission signal does include an error, the I²C destination device (252) may return, to the I²C source device (250), a negative acknowledgement and may discard the data. In this way, I²C devices may detect data transmission errors in an I²C system without extending the length of bit patterns in I²C data communications.

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for detecting data transmission errors in an I²C system according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for detecting data transmission errors in an I²C system according to embodiments of the present invention include modems for wired dial-up communications, Ethernet (IEEE 802.3) adapters for wired data communications, and 802.11 adapters for wireless data communications.

The arrangement of computers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
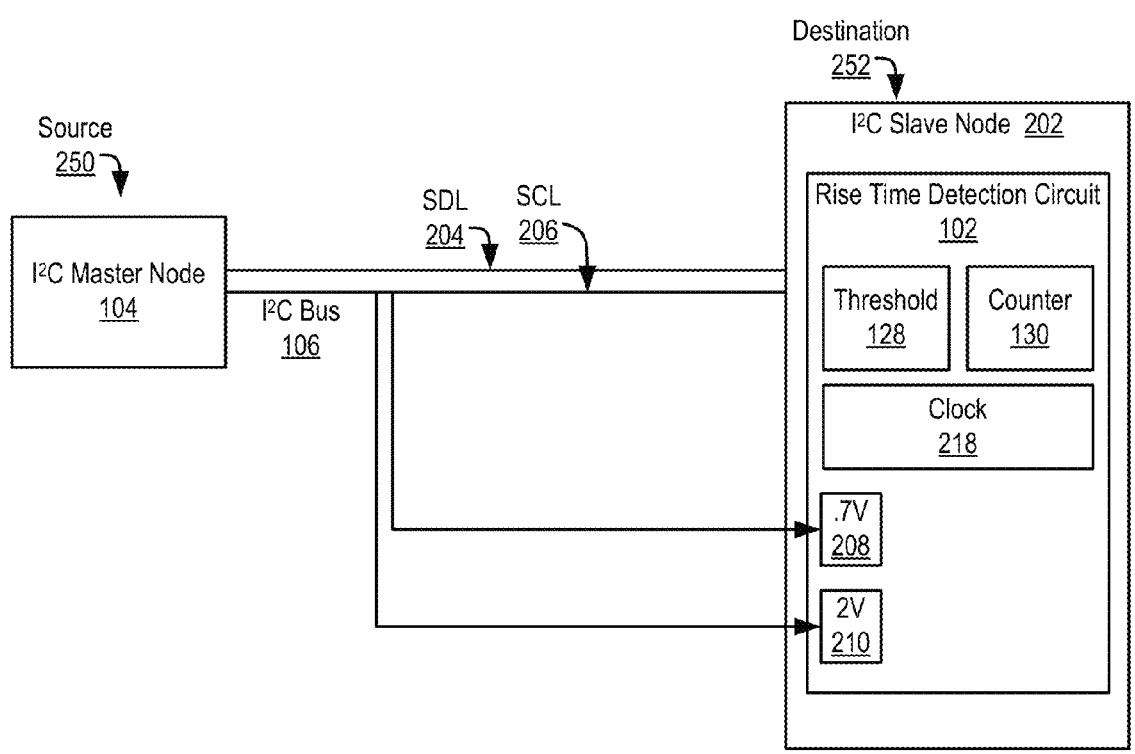
FIG. 2 sets forth a block diagram of another exemplary system for detecting data transmission errors in an I2C system according to embodiments of the present invention.

For further explanation, FIG. 2 sets forth a block diagram of another exemplary system for detecting data transmission errors in an I²C system according to embodiments of the present invention. The system of FIG. 2 includes an I²C master (104)—configured here as an I²C source device and an I²C slave (202) configured an I²C destination device (252). The master (104) is coupled for data communications to the slave (202) by an I²C bus (106) that includes a plurality of signal lines: a serial clock line ('SCL') (206) and a serial data line ('SDL') (204). The I²C slave (202) also includes a rise time detection circuit (102) and the SDL (204) is coupled to the rise time detection circuit (102). The rise time detection circuit (102) is configured to monitor a voltage of the SDL (204), where the voltage alternates between a logic low voltage (such as 0V) and a logic high voltage (such as 3.3V).

The I²C source device (250) in the example of FIG. 2 calculates parity of a set of bits to be transmitted to the I²C destination device on the SDL (204) and determines, in dependence upon the calculated parity, whether to inject a parity bit in the set of bits. If the I²C source device (250) determines to inject the parity bit, the I²C source device transmits the set of bits on the SDL with a preselected bit having a rise time less than a predefined threshold.

The rise time detection circuit (102) of the I²C destination device (252) receives the signal transmitted by the I²C master (104) on the SDL (204) and detects a first voltage of the preselected bit on the SDL (204), where the first voltage is greater than the logic low voltage. The first voltage, for example, may be implemented as 0.7V. In the example of FIG. 2, the rise time detection circuit (102) includes two inputs (208, 210), where one input (208) is configured to detect the first voltage (in this example, 0.7V) and the other input (210) is configured to detect a second voltage (in this example, 2V).

Responsive to the detection of the first voltage, the rise time detection circuit (102) starts an automatically incrementing counter (130). The counter increments once for each clock (218) period of the rise time detection circuit (102). The period of the clock (218) of the rise time detection circuit (102) is less than the rise time of the I²C signal line.

The rise time detection circuit (102) then detects a second voltage (2V in this example) on the signal SDL (204). The second voltage is greater than the first voltage and less than the logic high voltage. Responsive to the detection of the second voltage, the rise time detection circuit (102) stops the automatically incrementing counter (130).

The rise time detection circuit (102) then calculates, in dependence upon the clock period of the rise time detection circuit and the value of the counter (130), a rise time for the signal line. The rise time detection circuit (102) may calculate such a rise time by calculating the product of the clock (218) period of the rise time detection circuit (102) and the value of the counter.

The rise time detection circuit (102) then determines whether the calculated rise time is less than a predefined threshold (128). If the rise time of the preselected bit is less than the predefined threshold, the I²C destination device determines that the I²C source device did injected a parity bit in the data transmission signal. If the rise time of the preselected bit is not less than the predefined threshold, the I²C destination device (252) determines that the I²C source device did not inject a parity bit in the data transmission signal. The I²C destination device (252) then determines whether the data transmission signal on the SDL (204) includes an error in dependence upon the parity of the set of bits of the data transmission signal.

Figure 3:
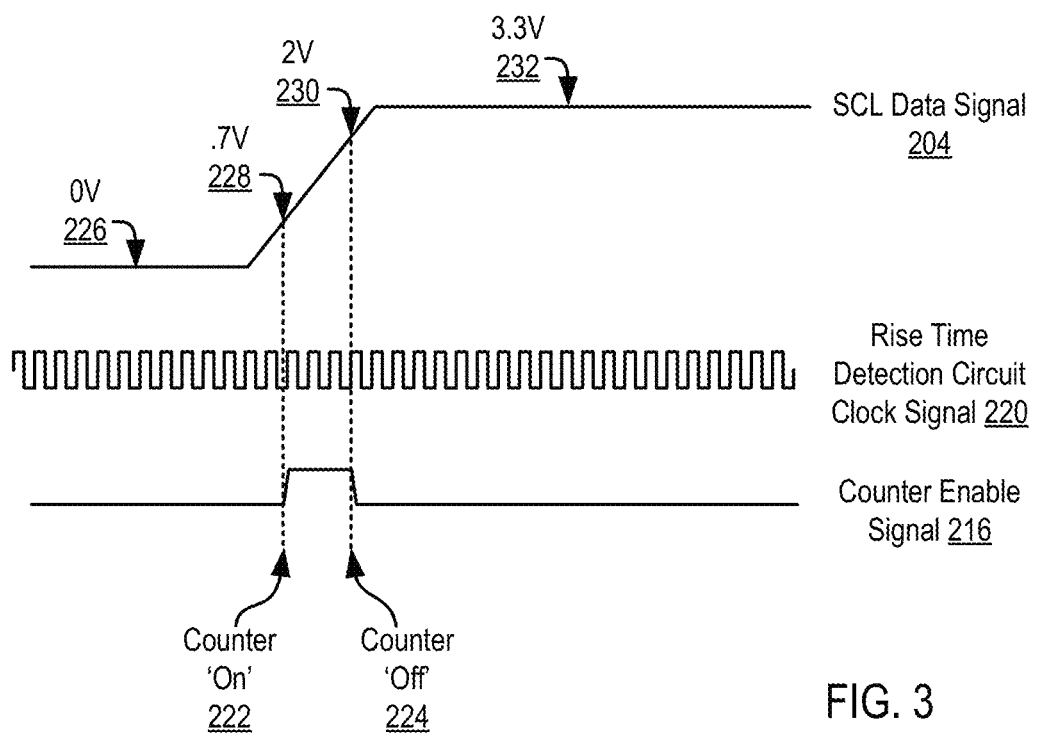
FIG. 3 sets forth an example signal timing diagram illustrating some of the signals in the example system of FIG. 2.

For further explanation, FIG. 3 sets forth an example signal timing diagram illustrating some of the signals in the example system of FIG. 2. The example timing diagram of FIG. 3 includes an I²C signal, the SDL (204), the clock signal (218) of the clock in the rise time detection circuit (102) and an enable signal (216) for the automatically incrementing counter (130).

In the example of FIG. 3, as the preselected bit of the bit pattern transmitted on the SDL (204) rises, the rise time detection circuit (102) detects a first voltage (228) of 0.7V on the signal line. Responsive to the detection of the first voltage (228), the rise time detection circuit (102) starts (222) an automatically incrementing counter (130) through use of the enable signal (216). The counter increments once for each clock signal (218) period of the rise time detection circuit (102).

As SDL signal (204) continues to rise, the rise time detection circuit (102) detects a second voltage (230) of 2V on the signal line. Responsive to the detection of the second voltage (230), the rise time detection circuit (102) stops (224) the automatically incrementing counter, again through use of the counter enable signal (216).

The rise time detection circuit (102) then calculates a rise time for the SDL signal (204) in dependence upon the period of the clock signal (218) and the value of the counter. In the example of FIG. 3, three periods of the rise time detection circuit clock signal (218) elapse during the time in which the counter is automatically incrementing. That is, the value of the counter is three. Consider, as an example, that the period of the clock signal is 10 nanoseconds (ns). In such an example, the rise time detection circuit may calculate a rise time of 30 ns (the counter value of 3 multiplied by 10 nanoseconds per clock period).

The rise time detection circuit (102) then determines whether the calculated rise time is less than a predefined threshold. If the calculated rise time is less than the predefined threshold, the I²C destination device (250) determines that the I²C source device (252) injected a parity bit in the data transmission signal. If the calculated rise time is not less than the predefined threshold, the I²C destination device (250) determines that the I²C source device (252) did not inject a parity bit in the data transmission signal. The I²C destination device (250) then determines whether the data transmission signal includes an error in dependence upon the parity of the set of bits of the data transmission signal.

Figure 4:
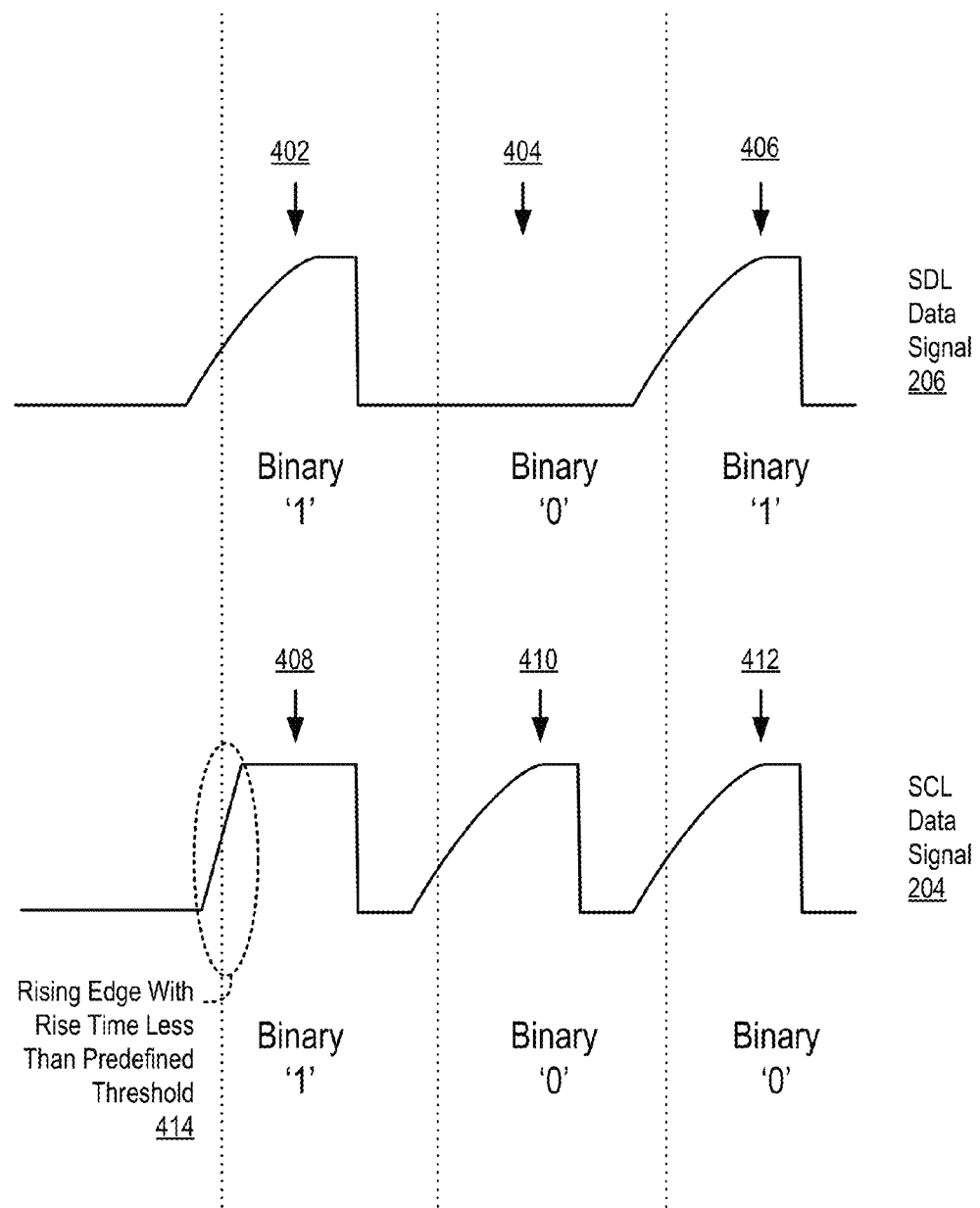
FIG. 4 sets forth an example signal timing diagram illustrating an SDL signal that includes a parity bit injected according to embodiments of the present invention.

For further explanation, FIG. 4 sets forth an example signal timing diagram illustrating an SDL signal that includes a parity bit injected according to embodiments of the present invention. The example timing diagram of FIG. 4 includes three clock periods of an SDL (204) signal with three bits depicted. Readers of skill in the art will recognize that a bit pattern transmitted form an I²C source device to an I²C destination device may include any number of bits.

In the example of FIG. 1, the first bit (402) in the bit pattern of the SDL signal (400) is injected with a parity bit, while the second (404) and third (406) bits are not. The first bit (402), being a logic high voltage represents a binary '1' in the data transmission. Additionally, the rising edge having the rise time less than a predefined threshold (408) indicates a parity value of '1'. That is, the first bit in the bit pattern of FIG. 4 indicates both a binary value in a set of bits and a binary value of parity. If not injected with a parity bit, the rising edge of the first bit has a rise time not less than the predefined threshold.

Figure 5:
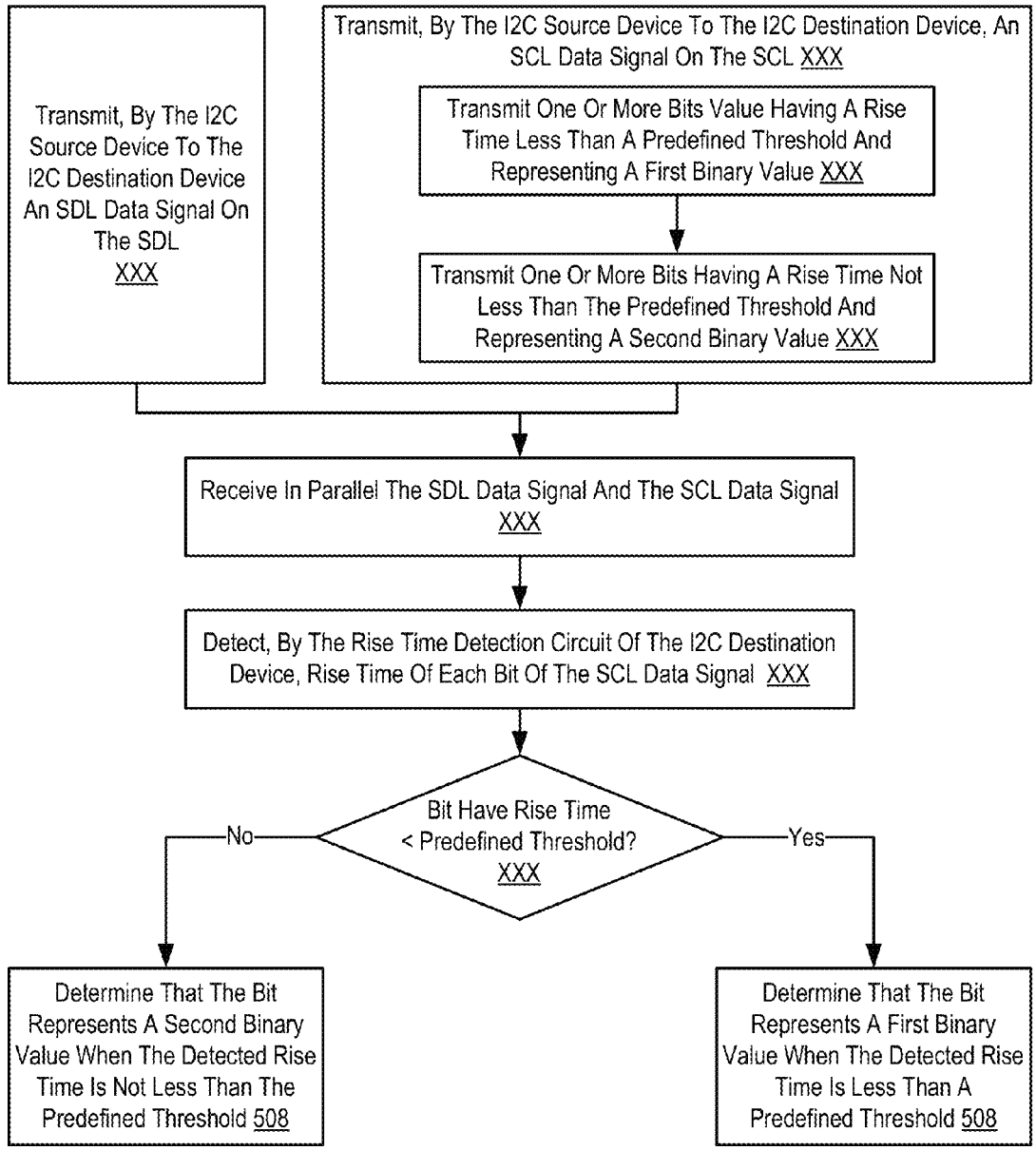
FIG. 5 sets forth a flow chart illustrating an exemplary method for detecting data transmission errors in an I2C system according to embodiments of the present invention.

For further explanation, FIG. 5 sets forth a flow chart illustrating an exemplary method for detecting data transmission errors in an I²C system according to embodiments of the present invention. The example method of FIG. 5 is carried out in an I²C system similar to that of FIG. 1 or FIG. 2 that includes an I²C source device (250), an I²C destination device (252), and a data transmission signal line (204) coupling the I²C source device (250) and the I²C destination device (252). The data transmission signal line (204) is configured to carry data transmission signals between the I²C source device (250) and I²C destination device (252).

The method of FIG. 5 includes calculating (502), by the I²C source device, parity of a set of bits, the set of bits to be transmitted to the I²C destination device on the data transmission signal line. Calculating (502) parity of a set of bits in the example of FIG. 5 may be carried out by counting the number of binary 1's in the set of bits to be transmitted to the destination device and determining whether the number is even or odd, depending on the parity scheme supported by the I²C destination and source devices.

The method of FIG. 5 also includes determining (504), by the I²C source device in dependence upon the calculated parity, whether to inject a parity bit in the set of bits.

Determining (504) whether to inject a parity bit in the set of bits may be carried out in various ways depending on whether the I2C destination and source devices support an even parity scheme or an odd parity scheme. When using even parity, the parity bit is injected (set to 1) if the number of ones in the set of bits (not including the parity bit) is odd, making the number of ones in the entire set of bits (including the parity bit) even. If the number of ones in a given set of bits is already even, the parity bit is not injected (the value is set to a 0). When using odd parity, the parity bit is injected (set to 1) if the number of ones in the set of bits (not including the parity bit) is even, keeping the number of ones in the entire set of bits (including the parity bit) odd.

If the I²C source device determines to inject the parity bit, the method of FIG. 5 continues by transmitting (508) the set of bits in a data transmission signal with a preselected bit having a rise time less than a predefined threshold. If the I²C source device determines not to inject the parity bit, the method of FIG. 5 continues by transmitting (506) the set of bits in a data transmission signal, with the preselected bit having a rise time not less than the predefined threshold. In the method of FIG. 5, transmitting (508) the set of bits in a data transmission signal with a preselected bit having a rise time less than a predefined threshold may be carried out by driving the preselected bit to a logic high with an active driver and transmitting (506) the set of bits in a data transmission signal with the preselected bit having a rise time not less than the predefined threshold may be carried out by passively driving the preselected bit to a logic high. Driving the preselected bit to a logic high value with an active driver may be carried out with tri-state active buffer or other active driver, while driving the preselected bit to a logic high value passively may be carried out with a pull-up resistor or the like.

In some embodiments, transmitting (508) the set of bits in a data transmission signal with a preselected bit having a rise time less than a predefined threshold includes transmitting (508) the set of bits in the data transmission signal with the first bit of the set of bits having a rise time less than the predefined threshold. In this way, the first bit of each set of bits in a data transmission indicates parity of the set of bits.

The method of FIG. 5 also includes receiving (510), from the I²C source device, a data transmission signal encoded with a set of bits. The data transmission signal includes voltage alternating between a logic low voltage and a logic high voltage. The method of FIG. 5 also includes detecting (512) rise time of a preselected bit in the set of bits of the data transmission signal. Detecting (512) rise time of a preselected bit in the set of bits of the data transmission signal may be carried out by a rise time detection circuit configured as part of the I²C destination device. Such detection (512) may be carried out by: detecting, by the rise time detection circuit, a first voltage of the preselected bit, the first voltage being greater than the logic low voltage; starting, by the rise time detection circuit, responsive to the detection of the first voltage, an automatically incrementing counter, the counter incrementing once for each clock period of the rise time detection circuit; detecting a second voltage on the preselect bit, the second voltage greater than the first voltage and less than the logic high voltage; stopping, by the rise time detection circuit responsive to the detection of the second voltage, the automatically incrementing counter; and calculating, in dependence upon the clock period of the rise time detection circuit and the value of the counter, a rise time for the preselected bit.

If the detected rise time of the preselected bit is less than a predefined threshold, the method of FIG. 5 continues by determining (518) that the I$^2$C source device injected a parity bit in the data transmission signal and if the detected rise time of the preselected bit is not less than a predefined threshold, determining (516) that the I$^2$C source device did not inject a parity bit in the data transmission signal.

The method of FIG. 5 also includes determining (620) whether the data transmission signal includes an error in dependence upon the parity of the set of bits of the data transmission signal. If the transmission signal does not include an error, the method of FIG. 5 continues by returning (524a), by the I$^2$C destination device, a positive acknowledgement to the I$^2$C source device confirming error-free reception of the data transmission. In an alternative, the I$^2$C destination device may return (524b) no acknowledgement to the I$^2$C source device. If the transmission signal does include an error, the method of FIG. 5 continues by returning, by the I$^2$C destination device to the I$^2$C source device, a negative acknowledgement (522) and discarding the data.

Although the I$^2$C source device is depicted several times in this specification as an I$^2$C master, where the I$^2$C destination device is depicted several times as an I$^2$C slave, readers of skill in the art will recognize that the I$^2$C source device may be implemented as either an I$^2$C master or slave and the I$^2$C destination device may be implemented as either an I$^2$C master or slave. That is, in some embodiments, the I$^2$C source device is an I$^2$C master, while the I$^2$C destination device is an I$^2$C slave. In some embodiments, the I$^2$C source device is an I$^2$C slave, while the I$^2$C destination device is an I$^2$C master. Further, the system need not be reconfigured to change these designations. The act of transmitting data or receiving data is the characteristic that defines whether an I$^2$C master is a destination device or source device and whether an I$^2$C slave is a destination device or source device.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of detecting data transmission errors in an Inter-Integrated Circuit ('I²C') system, the I²C system comprising an I²C source device, an I²C destination device, and a data transmission signal line coupling the I²C source device and the I²C destination device, the data transmission signal line configured to carry data transmission signals between the I²C source device and the I²C destination device, the method comprising:
    receiving, by the I²C destination device from the I²C source device, a data transmission signal, the data transmission signal encoded with a set of bits and comprising voltage alternating between a logic low voltage and a logic high voltage;
    detecting, by the I²C destination device, rise time of a preselected bit in the set of bits of the data transmission signal;
    if the detected rise time of the preselected bit is less than a predefined threshold, determining that the I²C source device injected a parity bit in the data transmission signal, and
    if the detected rise time of the preselected bit is not less than a predefined threshold, determining that the I²C source device did not inject a parity bit in the data transmission signal; and
    determining, by the I²C destination device, whether the data transmission signal includes an error in dependence upon the parity of the set of bits of the data transmission signal.

2. The method of claim 1 wherein:
    the I²C destination device comprises a rise time detection circuit; and
    detecting rise time of a preselected bit in the set of bits of the data transmission signal further comprises:
    detecting, by the rise time detection circuit, a first voltage of the preselected bit, the first voltage being greater than the logic low voltage;
    starting, by the rise time detection circuit, responsive to the detection of the first voltage, an automatically incrementing counter, the counter incrementing once for each clock period of the rise time detection circuit;
    detecting a second voltage on the preselect bit, the second voltage greater than the first voltage and less than the logic high voltage;
    stopping, by the rise time detection circuit responsive to the detection of the second voltage, the automatically incrementing counter; and
    calculating, in dependence upon the clock period of the rise time detection circuit and the value of the counter, a rise time for the preselected bit.

3. The method of claim 1 wherein detecting rise time of a preselected bit in the set of bits of the data transmission signal further comprises:
    detecting rise time of the first bit of the set of bits in the data transmission signal.

4. The method of claim 1 wherein:
    the I²C destination device comprises an I²C slave; and
    the I²C source device comprises an I²C master.

5. The method of claim 1 wherein:
    the I²C destination device comprises an I²C master; and
    the I²C source device comprises an I²C slave.

6. An Inter-Integrated Circuit ('I²C') destination device configured for detecting data transmission errors in an I²C system, the I²C system comprising an I²C source device and a data transmission signal line coupling the I²C source device and the I²C destination device, the data transmission signal line configured to carry data transmission signals between the I²C source device and the I²C destination device, the I²C destination device comprising a rise time detection circuit, the rise time detection circuit configured to carry out the steps of:
    receiving, from the I²C source device, a data transmission signal, the data transmission signal encoded with a set of bits and comprising voltage alternating between a logic low voltage and a logic high voltage;
    detecting rise time of a preselected bit in the set of bits of the data transmission signal;
    if the detected rise time of the preselected bit is less than a predefined threshold, determining that the I²C source device injected a parity bit in the data transmission signal, and
    if the detected rise time of the preselected bit is not less than a predefined threshold, determining that the I²C source device did not inject a parity bit in the data transmission signal; and
    determining whether the data transmission signal includes an error in dependence upon the parity of the set of bits of the data transmission signal.

7. The I²C destination device of claim 6 wherein detecting rise time of a preselected bit in the set of bits of the data transmission signal further comprises:
    detecting a first voltage of the preselected bit, the first voltage being greater than the logic low voltage;
    starting, responsive to the detection of the first voltage, an automatically incrementing counter, the counter incrementing once for each clock period of the rise time detection circuit;
    detecting a second voltage on the preselect bit, the second voltage greater than the first voltage and less than the logic high voltage;
    stopping, responsive to the detection of the second voltage, the automatically incrementing counter; and calculating, in dependence upon the clock period of the rise time detection circuit and the value of the counter, a rise time for the preselected bit.

8. The I²C destination device of claim 6 wherein detecting rise time of a preselected bit in the set of bits of the data transmission signal further comprises:
   detecting rise time of the first bit of the set of bits in the data transmission signal.

9. The I²C destination device of claim 6 wherein:
   the I²C destination device comprises an I²C slave; and
   the I²C source device comprises an I²C master.

10. The I²C destination device of claim 6 wherein:
    the I²C destination device comprises an I²C master; and
    the I²C source device comprises an I²C slave.

11. A method of detecting data transmission errors in an Inter-Integrated Circuit ('I²C') system, the I²C system comprising an I²C source device, an I²C destination device, and a data transmission signal line coupling the I²C source device and the I²C destination device, the data transmission signal line configured to carry data transmission signals between the I²C source device and I²C destination device, the method comprising:
    calculating, by the I²C source device, parity of a set of bits, the set of bits to be transmitted to the I²C destination device on the data transmission signal line;
    determining, by the I²C source device in dependence upon the calculated parity, whether to inject a parity bit in the set of bits;
    if the I²C source device determines to inject the parity bit, transmitting the set of bits in a data transmission signal with a preselected bit having a rise time less than a predefined threshold; and
    if the I²C source device determines not to inject the parity bit, transmitting the set of bits in a data transmission signal, with the preselected bit having a rise time not less than the predefined threshold,
    wherein the I²C destination device is configured to receive the data transmission signal, detect rise time of the preselected bit of the data transmission signal, determine whether a parity bit is injected in the data transmission signal in dependence upon the detected rise time, and determine whether the data transmission signal includes an error in dependence upon the parity of the set of bits of the data transmission signal.

12. The method of claim 1 wherein:
    transmitting the set of bits in a data transmission signal with a preselected bit having a rise time less than a predefined threshold further comprises driving the preselected bit to a logic high with an active driver; and
    transmitting the set of bits in a data transmission signal with the preselected bit having a rise time not less than the predefined threshold further comprises passively driving the preselected bit to a logic high.

13. The method of claim 1 wherein transmitting the set of bits in a data transmission signal with a preselected bit having a rise time less than a predefined threshold further comprises:
    transmitting the set of bits in the data transmission signal with the first bit of the set of bits having a rise time less than the predefined threshold.

14. The method of claim 1 wherein:
    the I²C destination device comprises an I²C slave; and
    the I²C source device comprises an I²C master.

15. The method of claim 1 wherein:
    the I²C destination device comprises an I²C master; and
    the I²C source device comprises an I²C slave.

16. An apparatus for detecting data transmission errors in an Inter-Integrated Circuit ('I²C') system, the I²C system comprising an I²C source device, an I²C destination device, and a data transmission signal line coupling the I²C source device and the I²C destination device, the data transmission signal line configured to carry data transmission signals between the I²C source device and I²C destination device, the apparatus comprising a computer processor, a computer memory operatively coupled to the computer processor, the computer memory having disposed within it computer program instructions that, when executed by the computer processor, cause the apparatus to carry out the steps of:
    calculating, by the I²C source device, parity of a set of bits, the set of bits to be transmitted to the I²C destination device on the data transmission signal line;
    determining, by the I²C source device in dependence upon the calculated parity, whether to inject a parity bit in the set of bits;
    if the I²C source device determines to inject the parity bit, transmitting the set of bits in a data transmission signal with a preselected bit having a rise time less than a predefined threshold; and
    if the I²C source device determines not to inject the parity bit, transmitting the set of bits in a data transmission signal, with the preselected bit having a rise time not less than the predefined threshold,
    wherein the I²C destination device is configured to receive the data transmission signal, detect rise time of the preselected bit of the data transmission signal, determine whether a parity bit is injected in the data transmission signal in dependence upon the detected rise time, and determine whether the data transmission signal includes an error in dependence upon the parity of the set of bits of the data transmission signal.

17. The apparatus of claim 16 wherein:
    transmitting the set of bits in a data transmission signal with a preselected bit having a rise time less than a predefined threshold further comprises driving the preselected bit to a logic high with an active driver; and
    transmitting the set of bits in a data transmission signal with the preselected bit having a rise time not less than the predefined threshold further comprises passively driving the preselected bit to a logic high.

18. The apparatus of claim 16 wherein transmitting the set of bits in a data transmission signal with a preselected bit having a rise time less than a predefined threshold further comprises:
    transmitting the set of bits in the data transmission signal with the first bit of the set of bits having a rise time less than the predefined threshold.

19. The apparatus of claim 16 wherein:
    the I²C destination device comprises an I²C slave; and
    the I²C source device comprises an I²C master.

20. The apparatus of claim 16 wherein:
    the I²C destination device comprises an I²C master; and
    the I²C source device comprises an I²C slave.

* * * * *